US007223623B2

(12) United States Patent
Teng et al.

(10) Patent No.: US 7,223,623 B2
(45) Date of Patent: May 29, 2007

(54) METHOD FOR FORMING A MODIFIED SEMICONDUCTOR HAVING A PLURALITY OF BAND GAPS

(75) Inventors: Jing Hua Teng, Singapore (SG); Soo Jin Chua, Singapore (SG); Jian Rong Dong, Singapore (SG)

(73) Assignees: Agency for Science, Technology and Research, Centros (SG); National University of Singapore, Singapore (SG)

( * ) Notice: Subject to any disclaimer, the term of this patent is extended or adjusted under 35 U.S.C. 154(b) by 257 days.

(21) Appl. No.: 10/510,357

(22) PCT Filed: Apr. 4, 2003

(86) PCT No.: PCT/SG03/00074

§ 371 (c)(1),
(2), (4) Date: Oct. 5, 2004

(87) PCT Pub. No.: WO03/085742

PCT Pub. Date: Oct. 16, 2003

(65) Prior Publication Data

US 2005/0153473 A1     Jul. 14, 2005

(30) Foreign Application Priority Data

Apr. 5, 2002   (SG) .............................. 200202027-9

(51) Int. Cl.
*H01L 21/00*         (2006.01)
(52) U.S. Cl. .................................. 438/35; 372/50.121
(58) Field of Classification Search .................. 438/35; 372/50.121
See application file for complete search history.

(56) References Cited

U.S. PATENT DOCUMENTS 4,731,338 A   3/1988   Ralston et al.

(Continued)

FOREIGN PATENT DOCUMENTS

GB         2358281       7/2001

(Continued)

OTHER PUBLICATIONS

Deppe, D.G. et al., "Atom diffusion and impurity-induced layer disordering in quantum well III-V semiconductor heterostructures." *J. Appl. Phys.* vol. 64 (12), Dec. 15, 1988, pp. R93-R113.

(Continued)

*Primary Examiner*—B. William Baumeister
*Assistant Examiner*—Matthew L. Reames
(74) *Attorney, Agent, or Firm*—Morriss O'Bryant Compagni

(57) ABSTRACT

A method for forming a modified semiconductor having a number of band gaps involves providing a semiconductor having a surface and a quantum region which emits photons in response to electrical or optical stimulation, the quantum region having an original band gap and being disposed under the surface and applying a number of layers of a number of materials to a number of selected regions of the surface, the materials being adapted to cause, upon thermal annealing, a number of different degrees of intermixing in a number of portions of the quantum region disposed immediately below each of the selected regions of the surface. The layers of materials can be applied in a dot or line pattern, or both, to increase the plurality of band gap tuning. The method includes thermally annealing the layers to the surface. The methods result in a modified semiconductor which exhibits a number of different band gaps in a number of portions of the quantum region depending upon the positioning of the layers of materials on the surface immediately above the respective portions of the quantum region.

40 Claims, 14 Drawing Sheets

U.S. PATENT DOCUMENTS

| | | | |
|---|---|---|---|
| 4,751,194 | A | 6/1988 | Cibert et al. |
| 4,865,923 | A | 9/1989 | Ralston et al. |
| 5,238,868 | A | 8/1993 | Elman et al. |
| 5,395,793 | A | 3/1995 | Charbonneau et al. |
| 5,399,900 | A | 3/1995 | Ko et al. |
| 5,708,674 | A | 1/1998 | Beernink et al. |
| 5,757,023 | A | 5/1998 | Koteles et al. |
| 5,764,669 | A | 6/1998 | Nagai |
| 5,766,981 | A | 6/1998 | Thornton et al. |
| 5,815,522 | A | 9/1998 | Nagai |
| 5,832,019 | A | 11/1998 | Paoli et al. |
| 5,843,802 | A | 12/1998 | Beernink et al. |
| 5,886,370 | A | 3/1999 | Sun et al. |
| 5,915,165 | A | 6/1999 | Sun et al. |
| 6,005,881 | A | 12/1999 | Ikoma |
| 6,027,989 | A | 2/2000 | Poole et al. |
| 6,238,944 | B1 | 5/2001 | Floyd |
| 6,514,784 | B1 | 2/2003 | Dubowski |
| 2001/0041379 | A1 | 11/2001 | Sakata |
| 2002/0003918 | A1 | 1/2002 | Ooi et al. |
| 2002/0004253 | A1 | 1/2002 | Ooi et al. |

FOREIGN PATENT DOCUMENTS

| | | |
|---|---|---|
| GB | 2369492 | 5/2002 |
| GB | 2409333 * | 6/2005 |

OTHER PUBLICATIONS

Ooi, Boon Siew et al., "Selective Quantum-Well Intermixing in GaAs-AlGaAs Structures Using Impurity-Free Vacancy Diffusion." *Ieee Journal of Quantum Electronics*, vol. 33, No. 10, Oct. 1997, pp. 1784-1793.

Choi, W.J. et al., "Dependence of Dielectric-Cap Quantum-Well Disordering of GaAs-AlGaAs Quantum-Well Structure on the Hydrogen Content in $SiN_x$ Capping Layer." *Ieee Journal of Selected Topics in Quantum Electronics*, vol. 4, No. 4, Jul./Aug. 1998, pp. 624-628.

Teng, J.H. et al., "Control of the band-gap shift in quantum-well intermixing using a germanium interlayer." *Applied Physics Letters*. vol. 76, No. 12, Mar. 20, 2000, pp. 1582-1584.

Marsh, J.H. et al., "Quantum well intermixing in material systems for 1.5 μm (invited)." *J. Vac. Sci. Technol. A* vol. 16(2), Mar./Apr. 1998, pp. 810-816.

* cited by examiner

METHOD FOR FORMING A MODIFIED SEMICONDUCTOR HAVING A PLURALITY OF BAND GAPS

This application claims priority to International Application PCT/SG03/00074 filed Apr. 4, 2003, and claims priority to Singapore Application No. SG 200202027-9 filed Apr. 5, 2002.

TECHNICAL FIELD

The present invention relates to semiconductor heterostructures and, in particular, relates to a method for forming a modified semiconductor having a plurality of band gaps.

BACKGROUND ART

Many optoelectronic devices consist of a quantum structure or quantum region embedded within a semiconductor heterostructure. These quantum regions may take the form of a quantum well, a superlattice, a quantum wire or a quantum dot. When manufacturing such semiconductor optoelectronic devices it is extremely important to control the optical band gap of the quantum structure. The monolithic integration of optoelectronic components requires the production of a heterostructure which has different transition energy levels across different areas of its surface. Achieving these different transition energy levels is known as "band gap tuning".

One known method of band gap tuning a semiconductor heterostructure is known as "impurity induced quantum well intermixing". This technique employs the diffusion of impurity atoms to enhance the quantum well intermixing. An example of this technique is described in U.S. Pat. No. 5,815,522 (Nagai).

This technique has the disadvantage that the diffusion of the impurities may alter the electrical properties of the semiconductor and deteriorate the optical quality of the device. For this reason, impurity induced intermixing is not quite suitable for the fabrication of active devices.

Another known method is called "ion-implantation induced intermixing." According to this technique, the intermixing is enhanced by the defects generated during ion implantation. Alternatively, the intermixing may be enhanced by ions implanted directly into the active region of the semiconductor. An example of this technique is described in U.S. Pat. No. 6,027,989 (Poole et al).

One application of the technique is described in U.S. Pat. No. 6,005,881 (Ikoma). That patent discloses a method of generating a semiconductor laser using ion implantation induced quantum well intermixing. The laser produced by that technique has a transparent output window structure which is suitable for high-powered operation.

However, one disadvantage of this method is that the ion implantation causes damage to the semiconductor heterostructure.

Another known method is called "impurity free vacancy enhanced disordering" (IFVD). According to this technique, a dielectric layer is deposited on top of the heterostructure in order to generate atomic vacancies at the interface of the dielectric layer and the semiconductor surface. These vacancies are generated at an elevated temperature. According to this technique the generated vacancies then diffuse into the heterostructure and thereby enhance the interdiffusion of atoms across the heterostructure.

The present inventors have developed a method for forming a modified semiconductor having a plurality of band gaps which overcomes or ameliorates at least some of the disadvantages of the prior art.

DISCLOSURE OF INVENTION

In a first aspect, the present invention provides a method for forming a modified semiconductor having a plurality of band gaps, the method comprising the steps of:
  providing a semiconductor having a surface and a quantum region which emits photons in response to electrical or optical stimulation, the quantum region having an original band gap and being disposed under said surface;
  applying a plurality of layers of a plurality of materials to a plurality of selected regions of said surface, said plurality of materials being adapted to cause, upon thermal annealing, a plurality of degrees of intermixing in a plurality of portions of said quantum region disposed immediately below each of said selected regions of said surface; and
  thermally annealing said plurality of layers to said surface such that said layers of said materials cause said plurality of degrees of intermixing in said plurality of portions of said quantum region thereby shifting the original band gaps of said portions of said quantum region,
  thereby forming a modified semiconductor which exhibits a plurality of different band gaps in said plurality of portions of said quantum region depending upon the positioning of said plurality of layers of said plurality of materials on the surface immediately above the respective portions of said quantum region.

Preferably, the step of applying a plurality of layers of a plurality of materials to a plurality of selected regions of the surface comprises applying the plurality of layers in a dot and/or line pattern to the plurality of selected regions of the surface, each of the patterned layers having different dot and/or line densities, and being adapted to cause, upon thermal annealing, a plurality of degrees of intermixing in a plurality of portions of the quantum region disposed immediately below each of the selected regions of the surface.

Preferably, the plurality of layers comprise between two and five layers and the plurality of materials comprise between two and five materials.

Preferably, at least one of said materials is selected from one of:
  (a) $SiO_2$; or
  (b) $Si_xN_y$, wherein x and y are integers greater than 0. More preferably, the step of applying the plurality of layers of the plurality of materials to the plurality of selected regions of the surface comprises applying at least one of layers using one or more of the following techniques:
  (a) plasma enhanced chemical vapor deposition (PECVD);
  (b) E-beam evaporation; or
  (c) the spin-on method.

Alternatively, at least one of the materials is selected from one of:
  (a) LTInP (low temperature deposited InP); or
  (b) LT(In)GaAs (low temperature deposited InGaAs or GaAs). More preferably, the step of applying the plurality of layers of the plurality of materials to the plurality of selected regions of the surface comprises applying at least one of the layers using one or more of the following techniques at a lower epitaxy temperature:_

(a) metal organic chemical vapor deposition (MOCVD); or
(b) molecular beam epitaxy (MBE).

Preferably, the step of applying a plurality of layers of a plurality of materials to a plurality of selected regions of the surface comprises applying one or more of the layers in a pattern. More preferably, the step of applying one or more of the layers in a pattern comprises:
(a) applying the layer to the selected region of the surface; and
(b) patterning the layer using one or more of the following techniques:
  (i) photolithography; or
  (ii) electron-beam lithography.

Preferably, the step of applying one or more of the layers in a pattern comprises applying the one or more layers in one or more of:
(a) a dot pattern comprising a plurality of dots separated by a plurality of spaces;
(b) an inverse dot pattern comprising a plurality of inverse dots separated by a plurality of inverse spaces;
(c) a line pattern comprising a plurality of lines separated by a plurality of spaces;
(d) an inverse line pattern comprising a plurality of inverse lines separated by a plurality of inverse spaces; or
(e) a planar pattern.

Preferably, the dots, inverse dots, lines and inverse lines have relatively uniform diameters within each pattern and wherein the spaces and inverse spaces are relatively uniform within each pattern. More preferably, the diameters of the dots and lines is less than or equal to 2 µm. Even more preferably, the spaces and inverse spaces are less than or equal to 2 µm.

Preferably, the step of applying the plurality of layers of the plurality of materials to the plurality of selected regions of the surface comprises applying the layers to a thickness ranging from 10 nm to 500 nm.

Preferably, the step of thermally annealing the heterostructure comprises rapidly thermally annealing the heterostructure by heating the heterostructure at temperatures ranging from 500 to 1000° C. for periods of time ranging from 1 to 1000 seconds.

Preferably, the semiconductor comprises:
(a) a semiconductor substrate; and
(b) a quantum region.

More preferably, the semiconductor substrate is made from either:
(a) InP; or
(b) GaAs.

Preferably, the quantum region comprises one or more of:
(a) a single quantum well structure;
(b) a multiple quantum well structure;
(c) a super lattice structure;
(d) a quantum wire structure; or
(e) a quantum dot structure.

Preferably, the quantum well structure comprises of one or more of:
(a) InGaAsP/InGaAsP;
(b) InGaAsP/InP;
(c) InGaAs/InP;
(d) GaAs/AlGaAs;
(e) InGaAs/GaAs;
(f) InGaAlAs/GaAs; or
(g) InGaAsN/GaAs.

In a second aspect, the present invention provides a modified semiconductor having a plurality of band gaps, the semiconductor comprising:

(a) a surface;

(b) a quantum region which emits photons in response to electrical or optical stimulation, the quantum region having an original band gap and being disposed under said surface; and (c) a plurality of layers of a plurality of materials disposed on a plurality of selected regions of said surface, said plurality of materials being adapted to cause, upon thermal annealing, a plurality of degrees of intermixing in a plurality of portions of said quantum region disposed immediately below each of said selected regions of said surface;
  wherein the plurality of layers are thermally annealed to said surface,
  and wherein said modified semiconductor exhibits a plurality of different band gaps in said plurality of portions of said quantum region according to the positioning of said plurality of layers of said plurality of materials on the surface immediately above the respective portions of said quantum region.

Preferably, the plurality of layers comprises a plurality of patterned layers disposed on the plurality of selected regions of the surface, each of the plurality of patterned layers comprising an array of dots and/or lines, each having different dot and/or line densities and being adapted to cause, upon thermal annealing, a plurality of degrees of intermixing in a plurality of portions of the quantum region disposed immediately below each of the selected regions of the surface.

In one form, the modified semiconductor takes the form of a laser.

Throughout this specification, unless the context requires otherwise, the word "comprise", or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

PREFERRED EMBODIMENT

A preferred embodiment of the invention will now be described, by way of example only, with reference to the accompanying drawings in which.

Figure 2A:
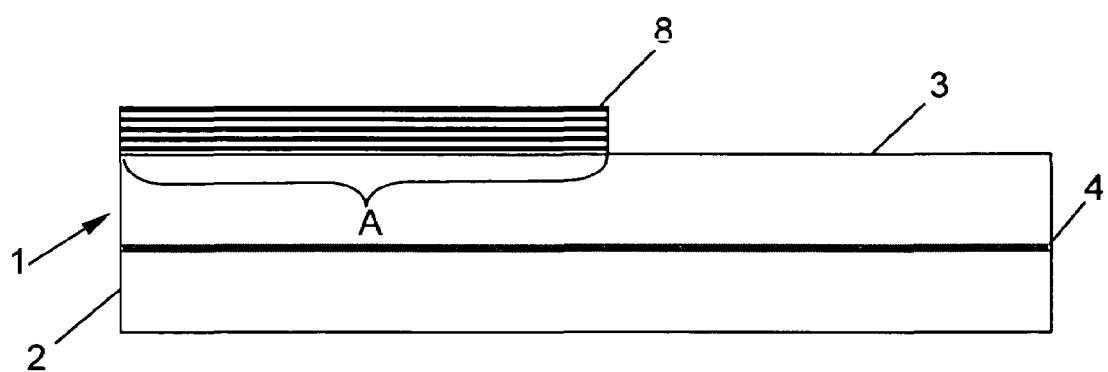
FIGS. 2A and 2B are schematic side views of a semiconductor heterostructure being band gap tuned according to a first preferred method.
Figure 2B:
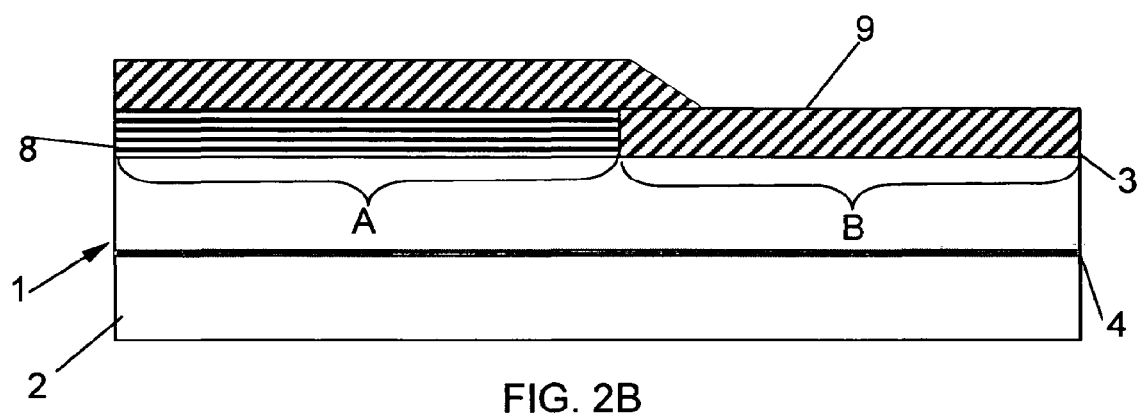

The present invention is a method of band gap tuning a semiconductor heterostructure. FIG. 2A shows a side view of an example semiconductor heterostructure 1. As seen in that figure, the heterostructure includes a semiconductor substrate 2 having a surface 3 and a quantum region 4 embedded therein. In this preferred embodiment, the semiconductor substrate is made up of one or more layers of InP or GaAs.

The quantum region 4 may be a single quantum well structure, a multiple quantum well structure, a superlattice structure, a quantum wire structure, a quantum dot structure or their combinations. When the quantum region 4 takes the form of a quantum well structure, it may be made up of any one of:

(a) InGaAsP/InGaAsP;

(b) InGaAsP/InP;

(c) InGaAs/InP;

(d) GaAs/AlGaAs;

(e) InGaAs/GaAs;

(f) InGaAlAs/GaAs; or (g) InGaAsN/GaAs.

Figure 1:
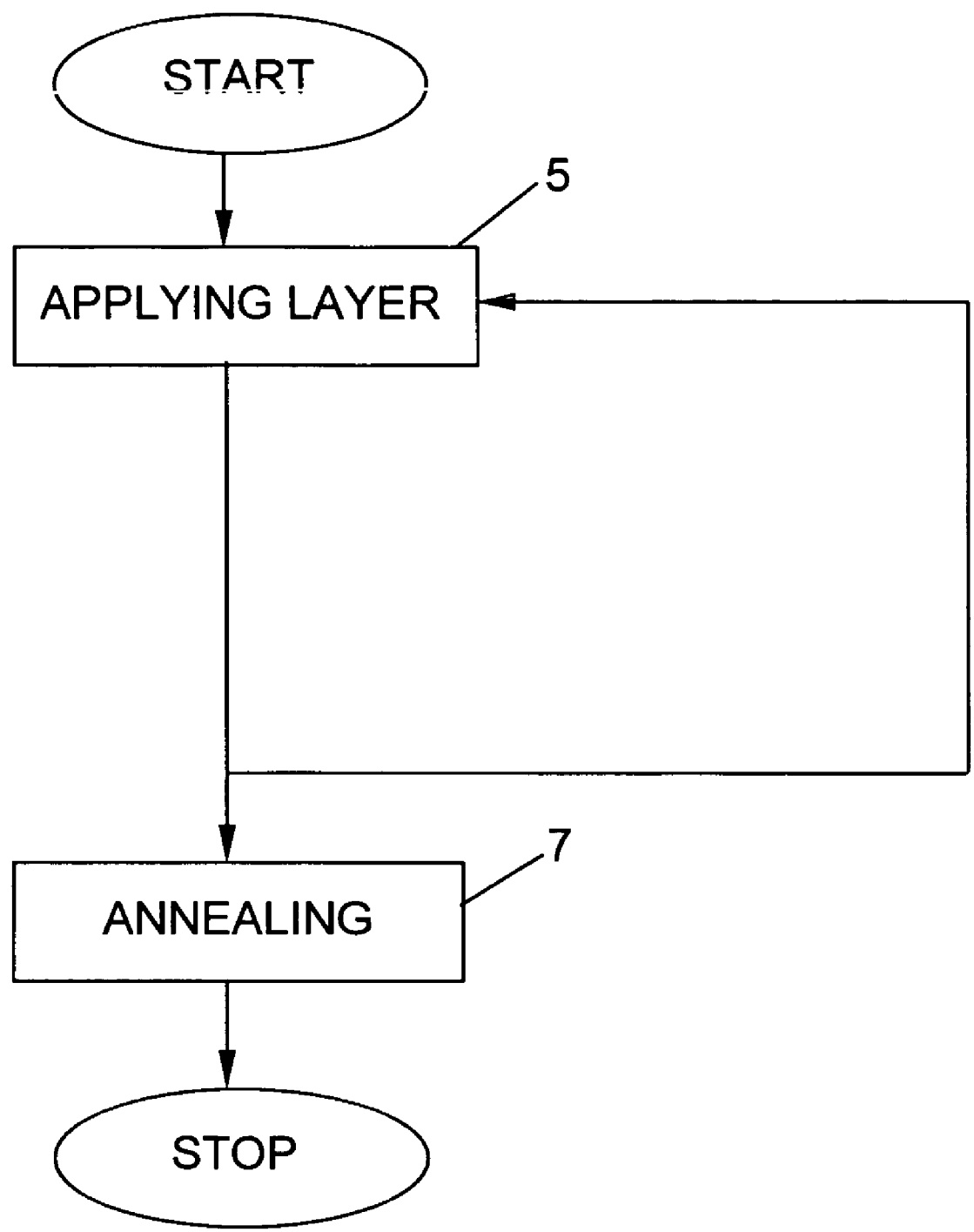
FIG. 1 is a flow chart illustrating the method of band gap tuning a semiconductor heterostructure according to the invention.

FIG. 1 shows a simplified flow chart of the first and second preferred methods of the present invention. The first step involves applying 5 a layer of a first material to first selected regions of the semiconductor surface 3. This applying step is then repeated for as many additional layers of additional materials as required. The preferred embodiment includes two, three or four layers of different materials. Further layers are also envisaged.

The materials should be selected so that each of the different materials varies the intermixing efficiency of the quantum region 4 to different degrees. Some materials should enhance the intermixing efficiency of the quantum region whereas others should suppress the intermixing efficiency of the quantum region.

As shown in FIG. 1, once the layers have been applied to the selected regions of the semiconductor surface 3, the next step involves annealing 7 the heterostructure. This annealing step will cause intermixing in the quantum region 4 and will produce a semiconductor heterostructure 1 with a surface 3 having particular regions which exhibit band gap shifts depending upon how many of layers of material they were covered by in the applying step 5. For example, if a region was only covered by a layer of the first material, it would exhibit a different band gap shift from another region of the surface which was only covered by a layer of the second material. In turn, a region which was covered by layers of both the first and second materials would exhibit a third degree of band gap shift.

Preferred embodiments of this method involving the application of two or three layers of material will now be described with reference to FIGS. 2A to 3C.

Turning to FIG. 2A, the first preferred method involves applying 5 a layer of a first material 8 to a region marked "A" on the semiconductor surface 3. The next step shown in FIG. 2B involves applying 6 a layer of a second material 9 to the regions marked "A" and "B" on the semiconductor surface 3.

The two materials 8,9 should be selected so that they vary the intermixing efficiency of the quantum region to different degrees. Some examples of appropriate layer materials are:

(a) $SiO_2$;

(b) $Si_xN_y$, wherein x and y are integers greater than zero;

(c) LTInP (low temperature deposited InP); or (d) LT(In)GaAs (low temperature deposited InGaAs or GaAs).

The inventors have found the following combinations to work well as the first and second materials respectively; $SiO_2$ and $Si_xN_y$, LTInP and $Si_xN_y$, LT(In)GaAs and $Si_xN_y$. A number of other combinations are also envisaged.

The layers of $SiO_2$ and $S_xN_y$ should be applied to the semiconductor surface 3 using any of the following techniques:

(a) plasma enhanced chemical vapour deposition (PECVD);

(b) E-beam evaporation; or (c) the spin-on method.

The layers of LTInP and LT(In)GaAs should be deposited on the semiconductor surface at a lower epitaxy temperature by either of the following techniques:

(a) metal organic chemical vapour deposition (MOCVD); or (b) molecular beam epitaxy (MBE).

Returning to FIG. 1, the next step involves thermally annealing the semiconductor heterostructure 1. This annealing step 7 involves rapidly thermally annealing the heterostructure at temperatures ranging from 500 to 1000° C. for time periods ranging from 1 to 1000 seconds. Different band gap shifts can be achieved with different annealing temperatures and times. These variations are discussed below with reference to the graph of FIG. 8.

This annealing causes intermixing in the quantum region 4 and results in different regions of the semiconductor surface 3 exhibiting different band gap shifts depending upon whether they were covered by a layer of the first material, a layer of the second material, or a layer of each of the first and second materials. For example, the region marked "A" in FIG. 2B would exhibit a band gap shift somewhere in between the band gap shifts usually exhibited by the first and second materials 8, 9, whereas the region marked "B" would exhibit a band gap shift corresponding to the usual band gap shift exhibited by the second material 9.

Figure 3A:
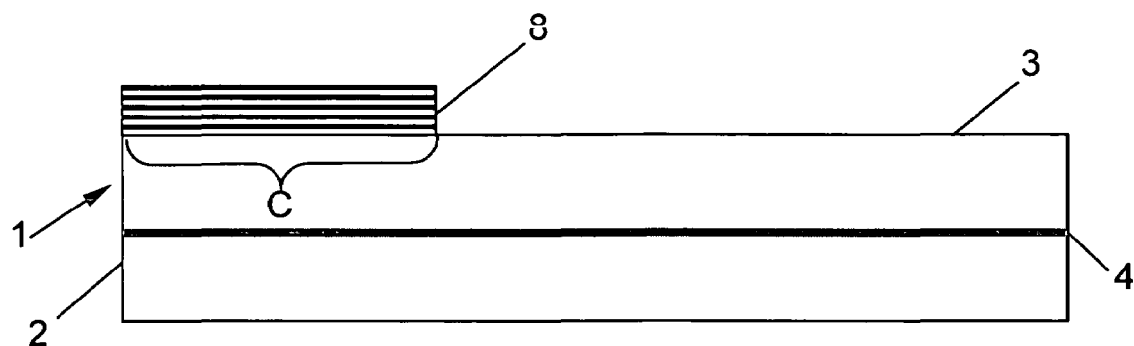
FIGS. 3A to 3C are schematic side views of a semiconductor heterostructure being band gap tuned according to a second preferred method.
Figure 3B:
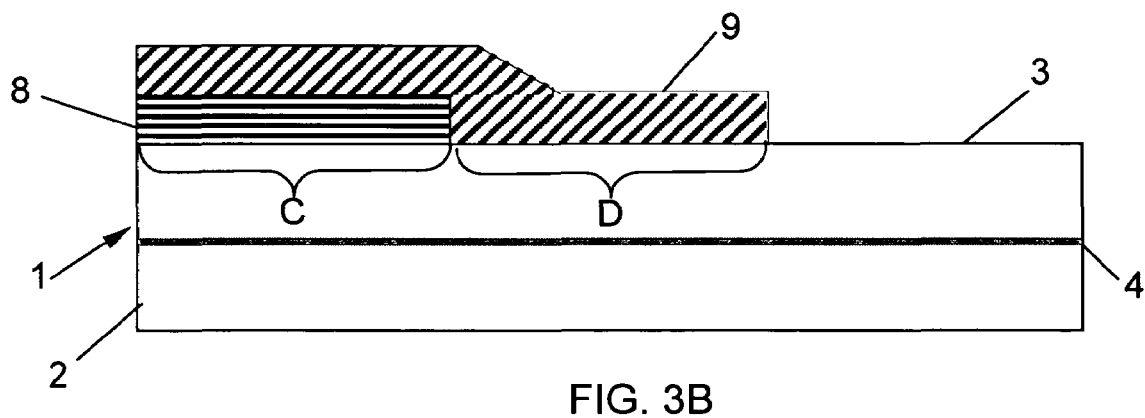
Figure 3C:
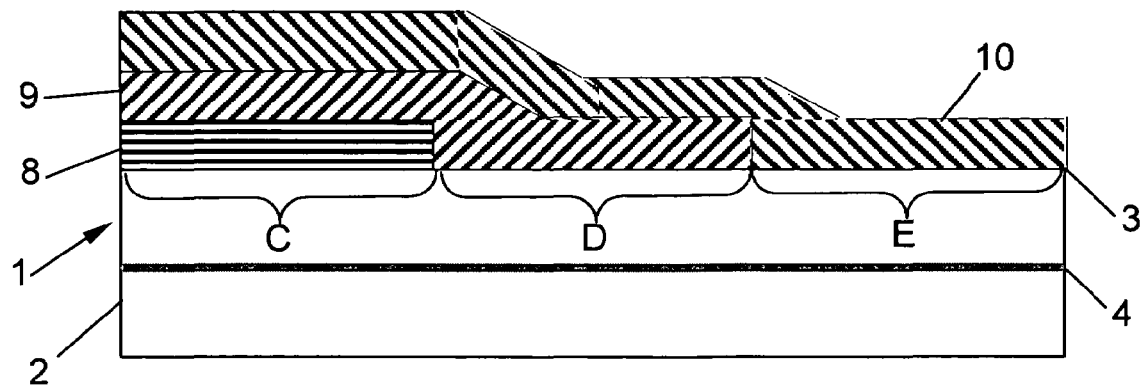

A second preferred method is illustrated in FIGS. 3A to 3C. The steps of applying 5 the layers of a first material 8 and a second material in FIGS. 3A and 3B are the same steps as described with reference to FIGS. 2A and 2B except that the layer of the first material 8 is applied in the region marked "C" and the layer of the second material 9 is applied in the regions marked "C" and "D". The same numerals have been used to indicate corresponding integers.

FIG. 3C shows the additional step of applying a layer of a third material 10 to a selected region (the regions marked "C", "D" and "E") of the surface 3. The materials used in each of the three layers may be selected from the same group of materials suggested above in the two layer version. Alternative materials may also be selected, providing that the three materials are adapted to vary the intermixing efficiency of the quantum region to different degrees. This is so that different combinations of the layers produce different band gap shifts.

Once the semiconductor heterostructure 1 shown in FIG. 3C is thermally annealed, the surface 3 of the semiconductor 1 will exhibit different band gap shifts at different regions of the surface depending upon the layers of first, second and third materials applied to that region.

By applying the different layers of material to different regions of the surface, a variety of different band gap shifts can be achieved in different regions of the semiconductor surface.

Figure 4:
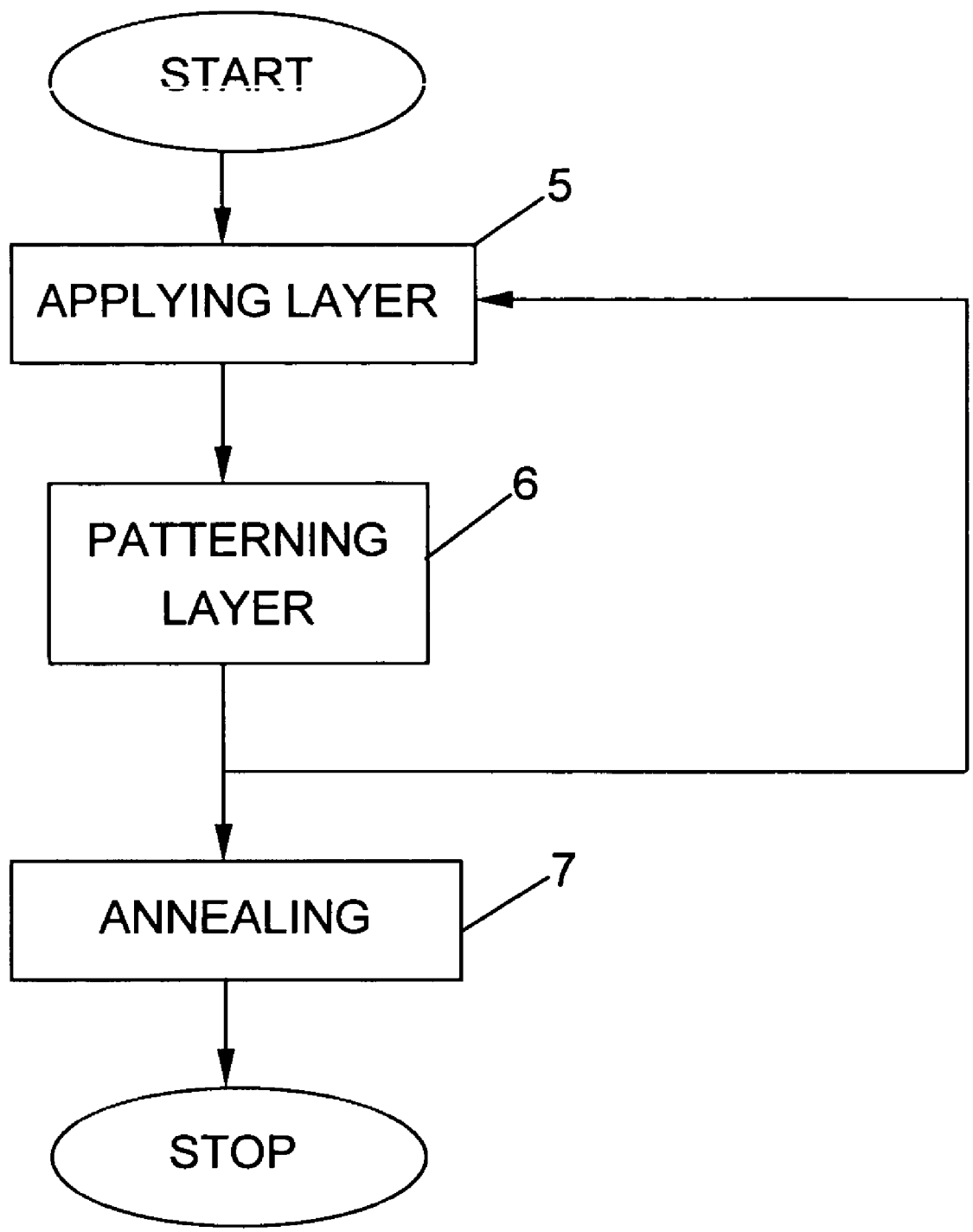
FIG. 4 is a flow chart illustrating the third preferred method according to the invention.

The embodiments described so far have involved the steps of applying 5 two or more layers of materials and annealing 7 them to band gap tune a semiconductor heterostructure. The method illustrated in the flow chart of FIG. 4 uses those same steps but adds the step of patterning 6 one or more of the layers to produce a wider variety of possible band gap shifts.

Figure 5A:
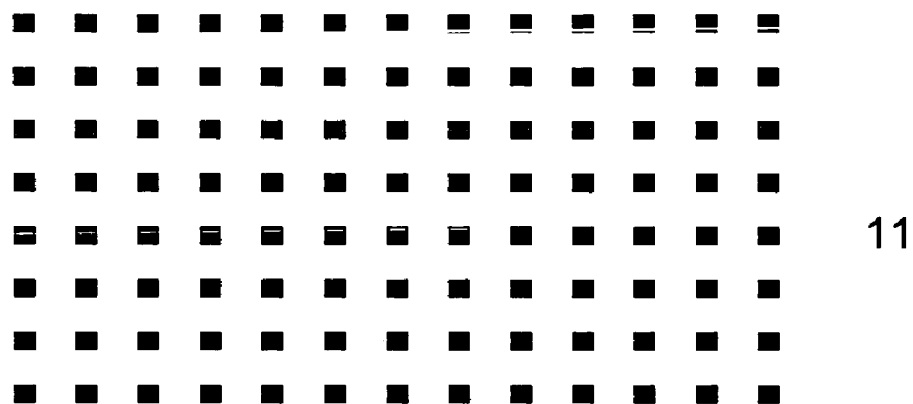
FIGS. 5A to 5C are schematic plan views of dot and line patterns employed in the third preferred method of the present invention.
Figure 5B:
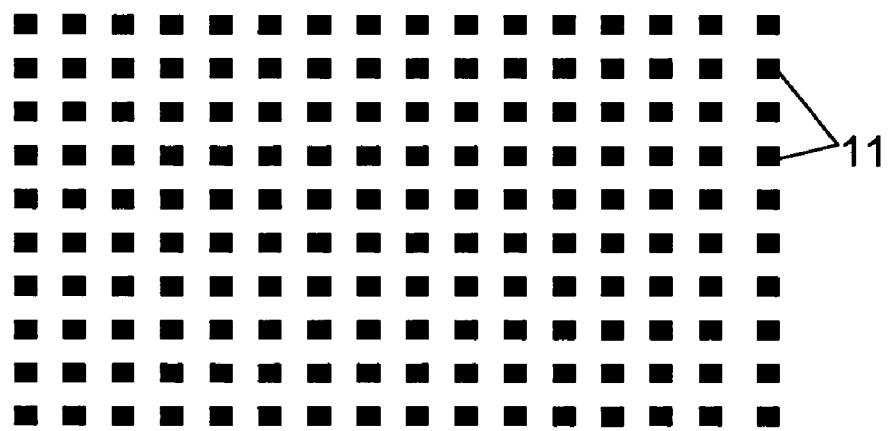
Figure 5C:
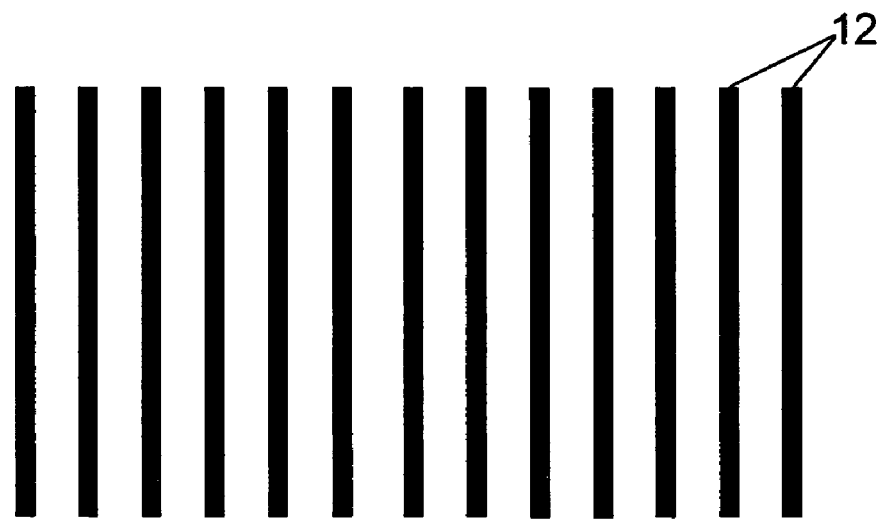

FIGS. 5A to 5C are schematic plan views of dot and line patterns employed in this third preferred method of the present invention.

In FIG. 5A a dot pattern is shown where the dots 11 each have a diameter of 1 µm. Each of the dots are separated from each other by 2 µm.

In FIG. 5B a dot pattern is shown where the dots 11 each have a diameter of 1 µm. Each of the dots are separated from each other by 1 µm.

In FIG. 5C a line pattern is shown in which each of the lines 12 have a diameter of 1 µm and are separated from one another by 2 µm.

The inventors have found that by applying the layers in these regular patterns, they can accurately control the surface coverage of particular materials and thereby control the band gap tuning. For example, in FIG. 5A, the spaces between the dots represent 90% of the surface area, the spaces between the dots in FIG. 5B represent 75% of the surface area and the spaces between the lines in FIG. 5C represent 67% of the surface area.

The inventors have found favourable results by applying a layer of material and then patterning the layer into the dot or line arrays using photolithography or electron-beam lithography. In the preferred embodiment, the diameters and separations of the dots 11 and lines 12 are relatively uniform and range from less than 1 µm up to 2 µm. Alternative pattern styles, sizes and separations are also envisaged including inverse dot patterns, inverse line patterns, planar patters, lattice style patterns and the like.

FIG. 6A to 6I are schematic side and plan views of a semiconductor heterostructure being band gap tuned according to the third preferred method which includes this patterning step.

Figure 6A:
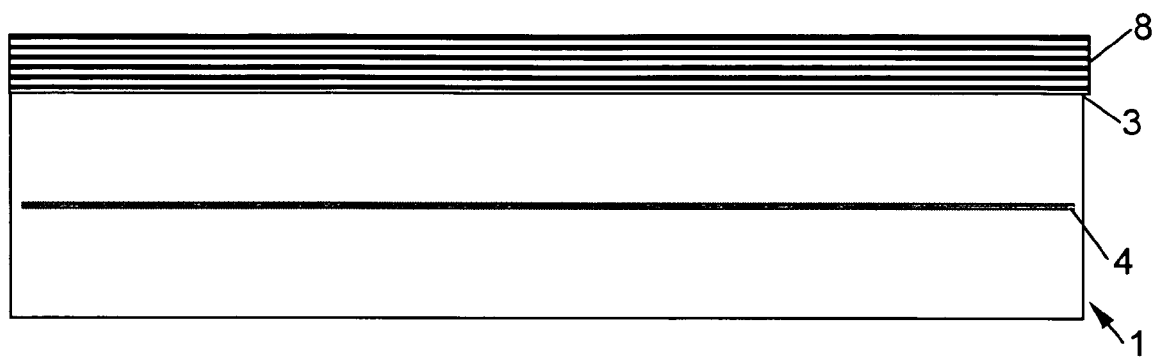
FIGS. 6A-6I are schematic side and plan views of a semiconductor heterostructure being band gap tuned according to the third preferred method.

As shown in FIG. 6A, the method involves applying 5 a layer of a first material 8 to a semiconductor heterostructure 1 having a surface 3 and a quantum region 4.

Figure 6B:
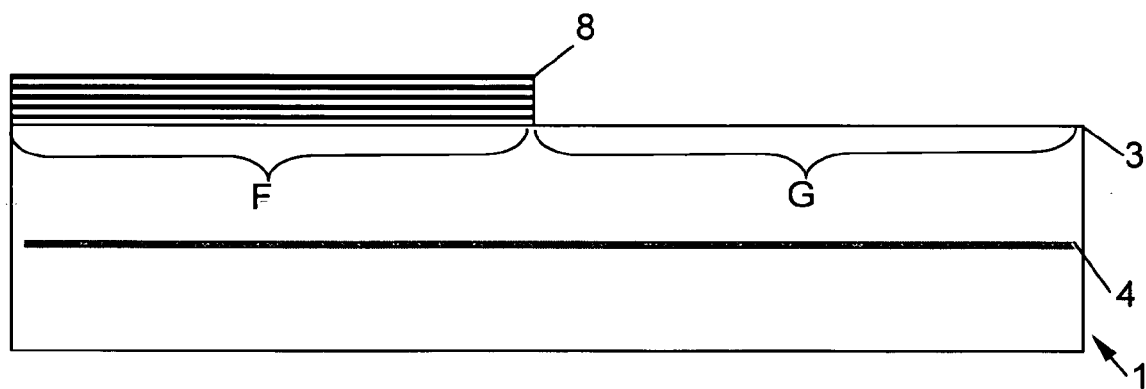

As shown in FIG. 6B, the next step involves removing part of the layer of first material from the surface 3 leaving a covered region marked "F" and an uncovered region marked "G".

Figure 6C:
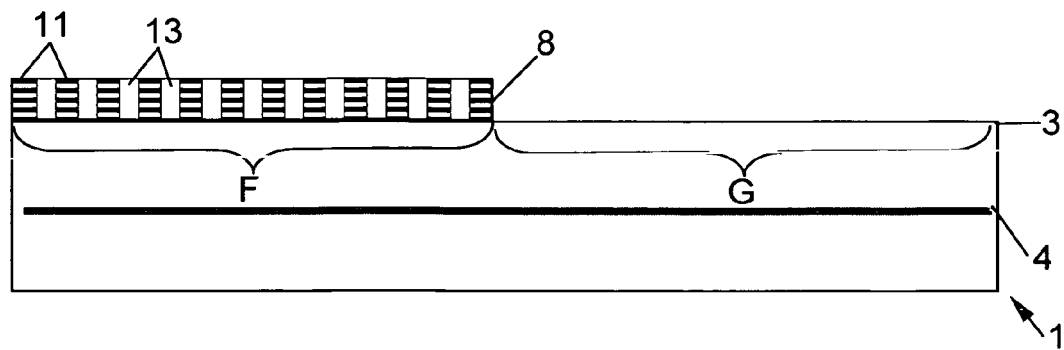
Figure 6D:
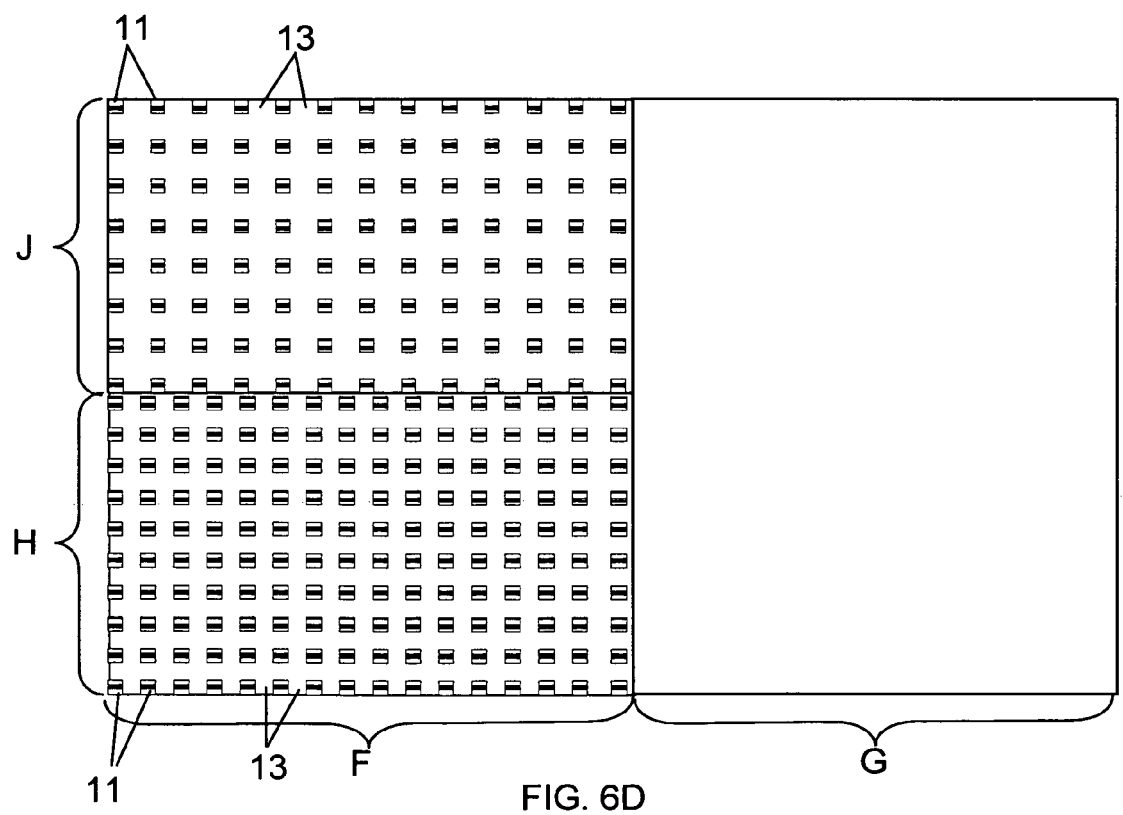

The next step, shown in the side view of FIG. 6C, involves patterning 6 the layer of the first material 8. In this example, two types of dot pattern are used. Referring to the plan view of FIG. 6D, the first pattern is applied to the area of the surface defined by the combination of the regions marked "F" and "H. This first pattern is a dot pattern of 1 µm dots 11 separated from each other by spaces 13 of 1 µm. The second dot pattern applied to the area of the surface defined by the combination of the regions marked "F" and "J" is a pattern of 1 µm dots separated by distances of 2 µm.

Figure 6E:
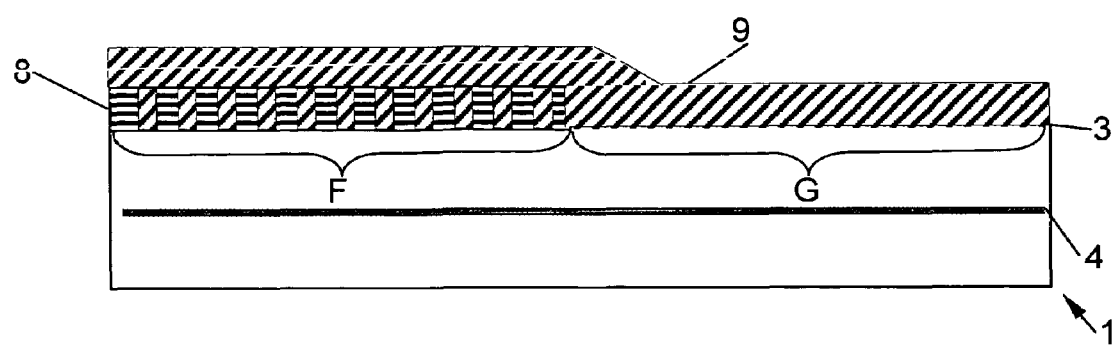

Turning to FIG. 6E, the next step involves applying a layer of a second material 9 to the semiconductor surface 3. In this example, it can be seen that the second material fills the spaces 13 between the dots 11 of the first material in the region marked "F". The layer of the second material also covers the region of the surface marked "G".

Figure 6F:
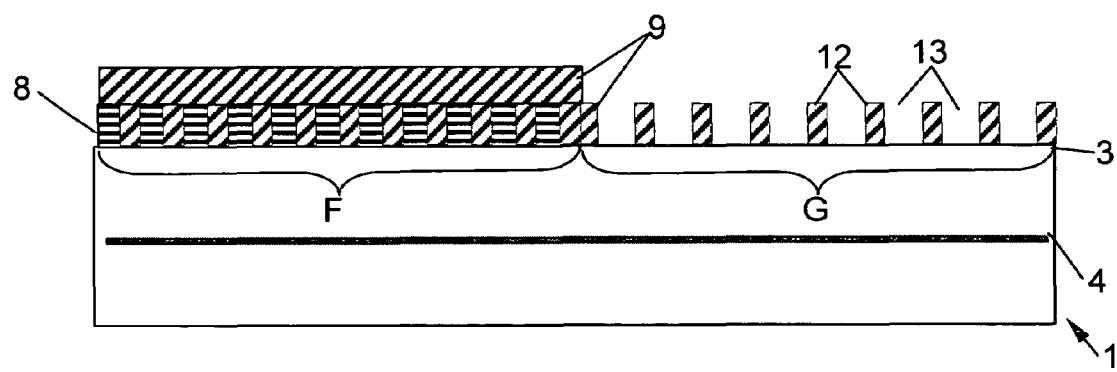
Figure 6G:
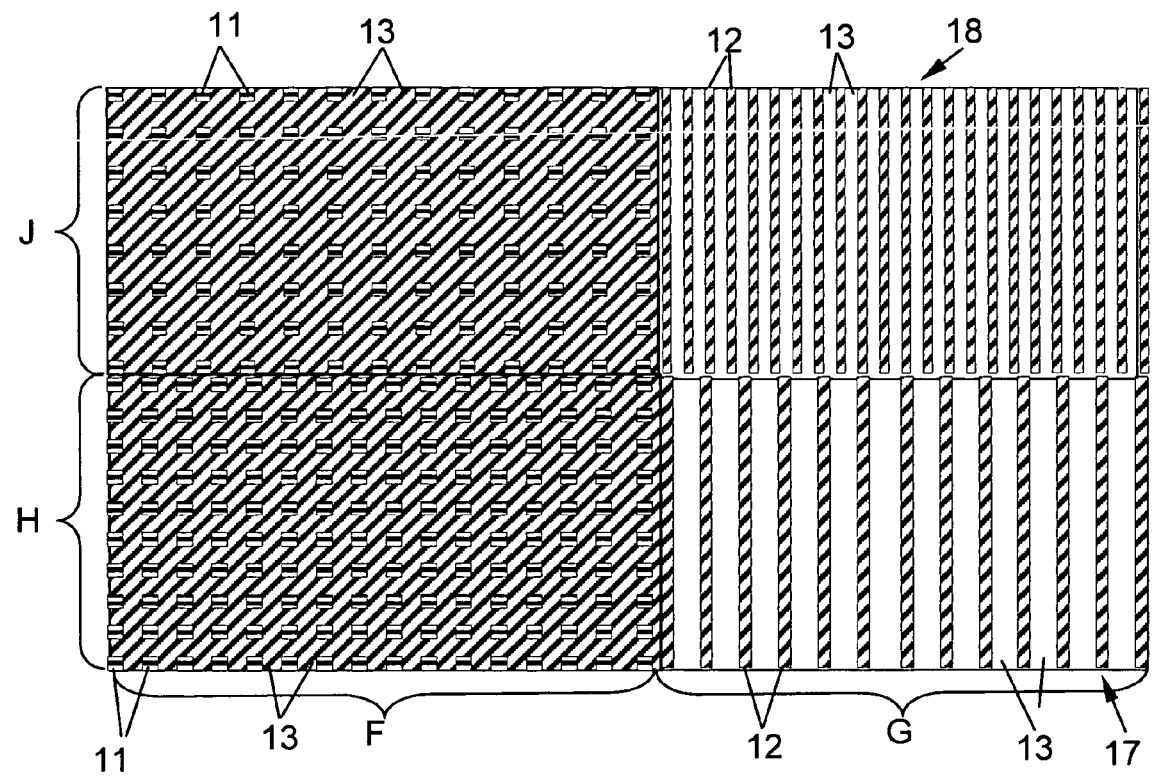

Turning to FIG. 6F, the next step involves patterning 6 the layer of the second material 9. In this example, two different line patterns are used in the region marked "G" to produce a number of lines 12 of the second material 9. As shown in the plan view of FIG. 6G, the first line pattern 17 is applied to the area of the surface defined by the combination of the regions marked "G" and "H". This is a line pattern of 1 µm lines 12 separated from one another by 2 µm spaces 13. The second line pattern 18 formed in the area of the surface defined by the combination of the regions marked "G" and "J" is a line pattern consisting of 1 µm lines 12 separated from one another by 1 µm spaces 13.

Figure 6H:
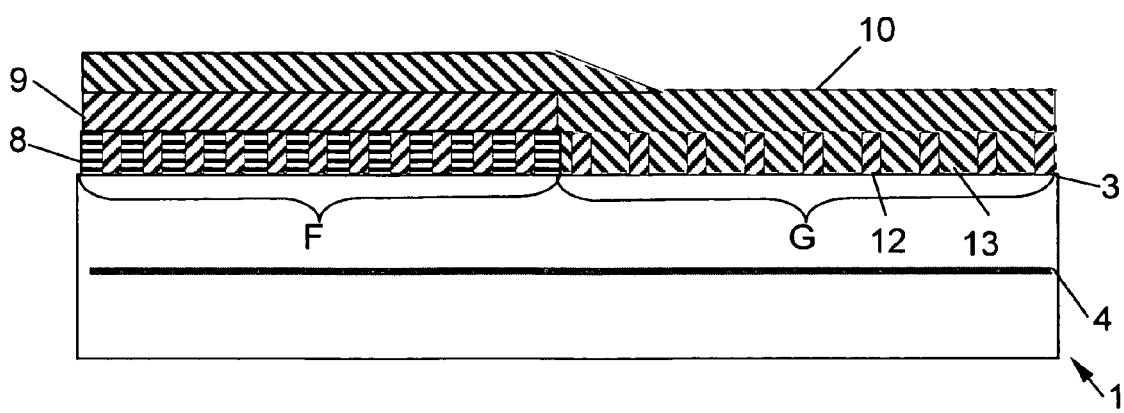

Turning now to FIG. 6H, the next step involves applying a layer of a third material 10 to the surface 3 of the semiconductor 1. As shown in that figure, the layer of third material 3 fills the gaps 13 between the lines 12 of the second material 9 in the region marked "G".

The next step involves thermally annealing 7 the heterostructure to cause intermixing in the quantum region thereby producing a semiconductor heterostructure with a surface having particular regions which exhibit different band gap shifts depending on which combination of materials they were covered by.

Figure 6I:
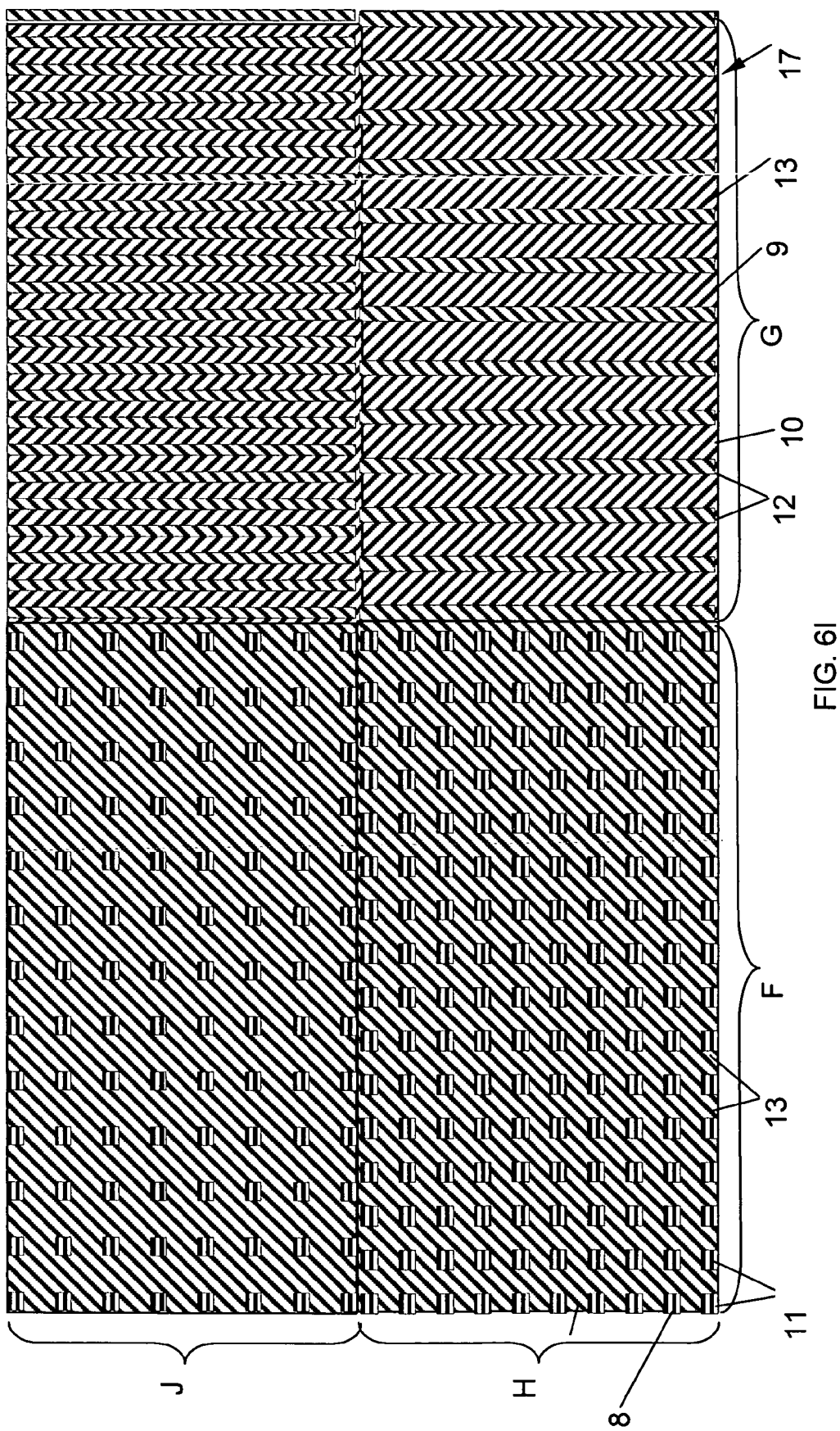

FIG. 6I shows the resultant semiconductor surface in plan view. Each of the four main regions of the semiconductor surface 3 (FH, FJ, GH and GJ) will exhibit different transition energy shifts depending up on the coverage ratio of each of the three materials.

Using this invention, a large variety of band gap shifts can be achieved by combining two, three, four or more layers of different materials and by applying them in different coverage ratios by patterning the layers in different ways. FIGS. 7 to 10 provides some specific examples of the different band gap shifts which can be achieved using different materials, different annealing processes and different pattern coverage ratios.

Figure 7:
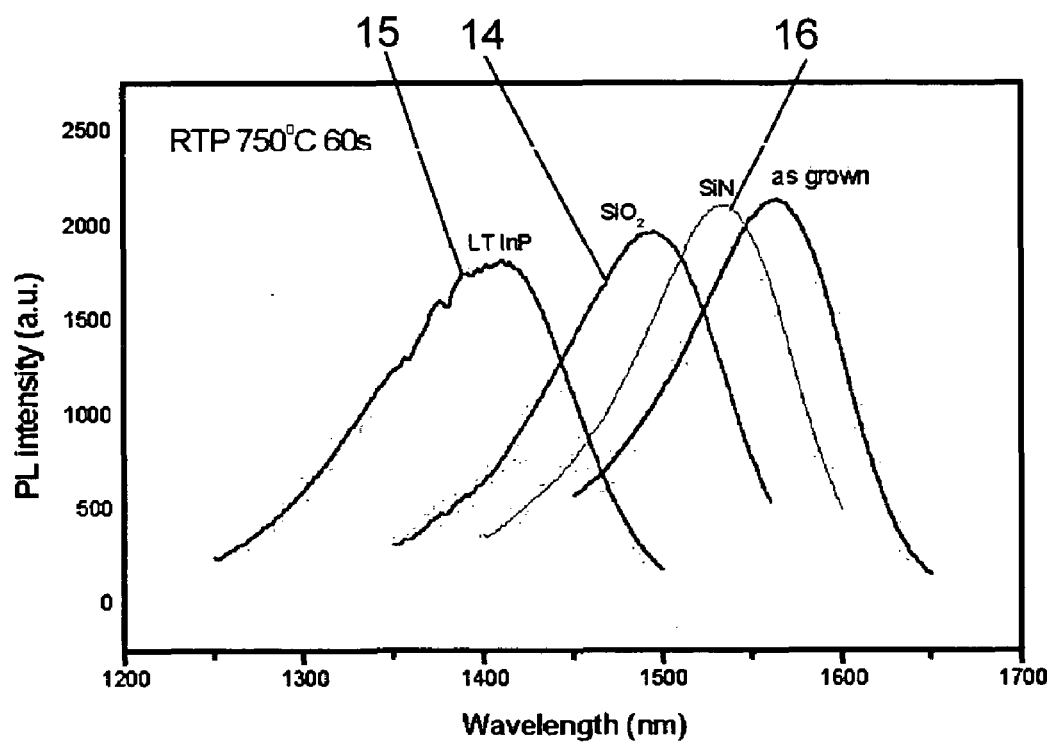
FIG. 7 is a graph of the photoluminescence spectra exhibited by a semiconductor heterostructure formed according to the second preferred method of the present invention.

FIG. 7 shows a graph of the photoluminescence spectra exhibited by a semiconductor heterostructure tuned according to the method of the present invention. In this example used a layer of LTInP 15 was applied to a first region of the surface, a layer of $SiO_2$ 14 was applied to an adjacent region of the surface and a layer SiN 16 was applied to another region of the surface. The surface of the heterostructure was a thin InGaAs capping layer. The semiconductor heterostructure was then rapidly thermally annealed at 750° C. for 60 seconds. The X axis of FIG. 7 represents the wavelength (in nanometres) and the Y axis represents the photoluminescent intensity exhibited by the quantum well structure. It can be seen from FIG. 7 that each of the different materials varied the intermixing efficiency of the quantum well structure to different degrees.

Figure 8:
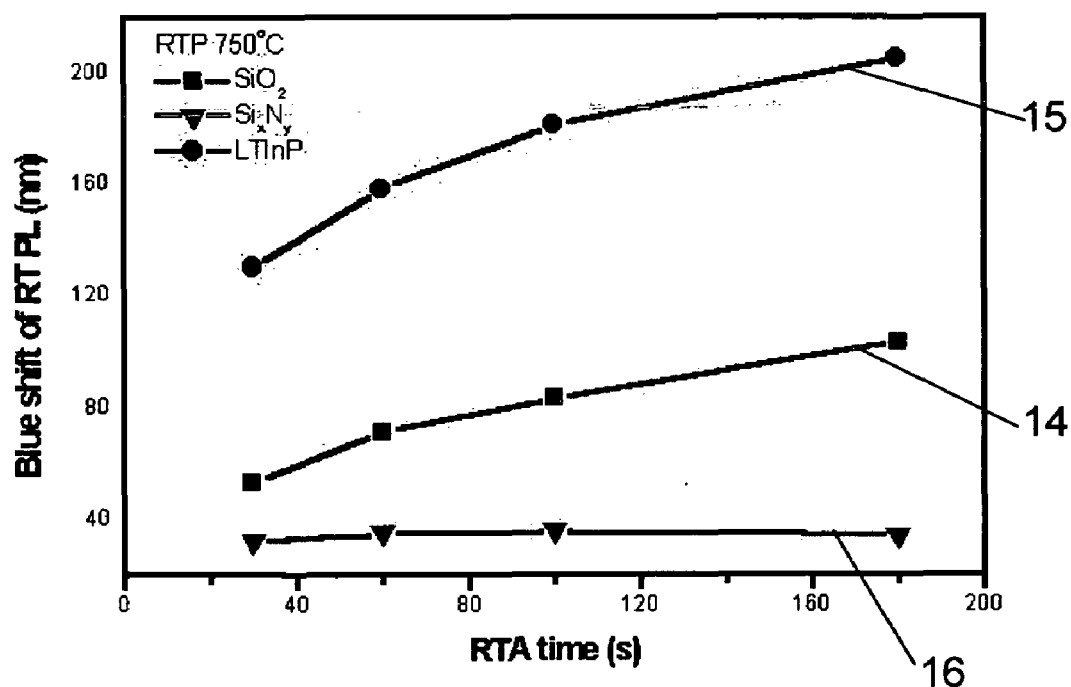
FIG. 8 is a graph illustrating the effect of annealing time on the blueshift of the photoluminescence peak wavelength of different layer materials.

FIG. 8 is a graph illustrating the effect of annealing time on the blueshift of the photoluminescence peak wavelength 9 of different layer materials. The X axis of FIG. 8 represents the annealing time in seconds and the Y axis represents the blueshift in nanometres. From these test results it can be seen that the blueshift of the photoluminescent peak energy for the $SiO_2$ covered sample 14 and the LTInP covered sample 15 increase as the annealing time increases. It can also be seen that a layer of LTInP will blueshift the band gap more than a layer of $SiO_2$. This graph also shows that the photoluminescent peak energy for the $Si_xN_y$ sample 16 remains substantially the same for the entire range of annealing times.

In the samples analysed the inventors applied $Si_xN_y$ films with thicknesses ranges from 30 nm to 240 nm using plasma enhanced chemical vapour deposition (PECVD). The inventors found that the suppression effect, in terms of photoluminescent blueshift, was the same for all of these thicknesses of film. These tests suggested that the material which blueshifts the band gap the least is $Si_xN_y$, the material which blueshifts the band gap the most is LTInP and the material which blueshifts the band gap to a medium degree is $SiO_2$.

Figure 9:
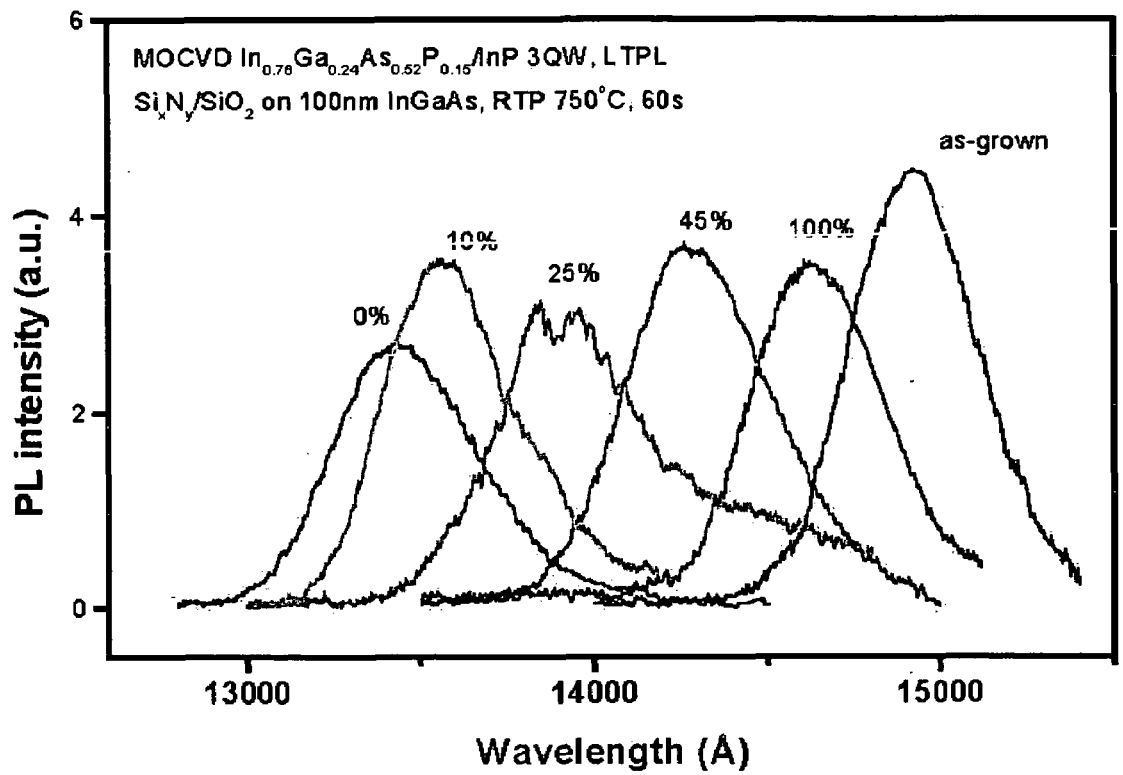
FIG. 9 is a graph illustrating the relationship between the coverage ratio and the wavelength of semiconductor heterostructures which have been band gap tuned according to the third preferred method.

Turning now to FIG. 9, this graph illustrates the effectiveness of the patterning step in band gap tuning a semiconductor heterostructure. In this experiment a semiconductor heterostructure having a three quantum well structure consisting of InGaAsP/InP was used. Five sample semiconductors were covered by a layer of $Si_xN_y$ and a layer of $SiO_2$ in different $Si_xN_y/SiO_2$ coverage ratios. The 0% coverage ratio indicates that the surface area was totally covered by $SiO_2$. The 10% coverage ratio indicates that the surface area was covered by 10% $Si_xN_y$ and the 100% coverage ratio indicates that the surface area was entirely covered by $Si_xN_y$. The intermediate coverage rations are self explanatory. This experiment indicated that the wavelengths exhibited by the quantum well could be accurately manipulated by varying the coverage ratios of the different layers.

It also indicated that the intermixing in the quantum wells was uniform since the photoluminescent spectra for samples with different $Si_xN_y/SiO_2$ coverage ratios had similar line widths.

Figure 10:
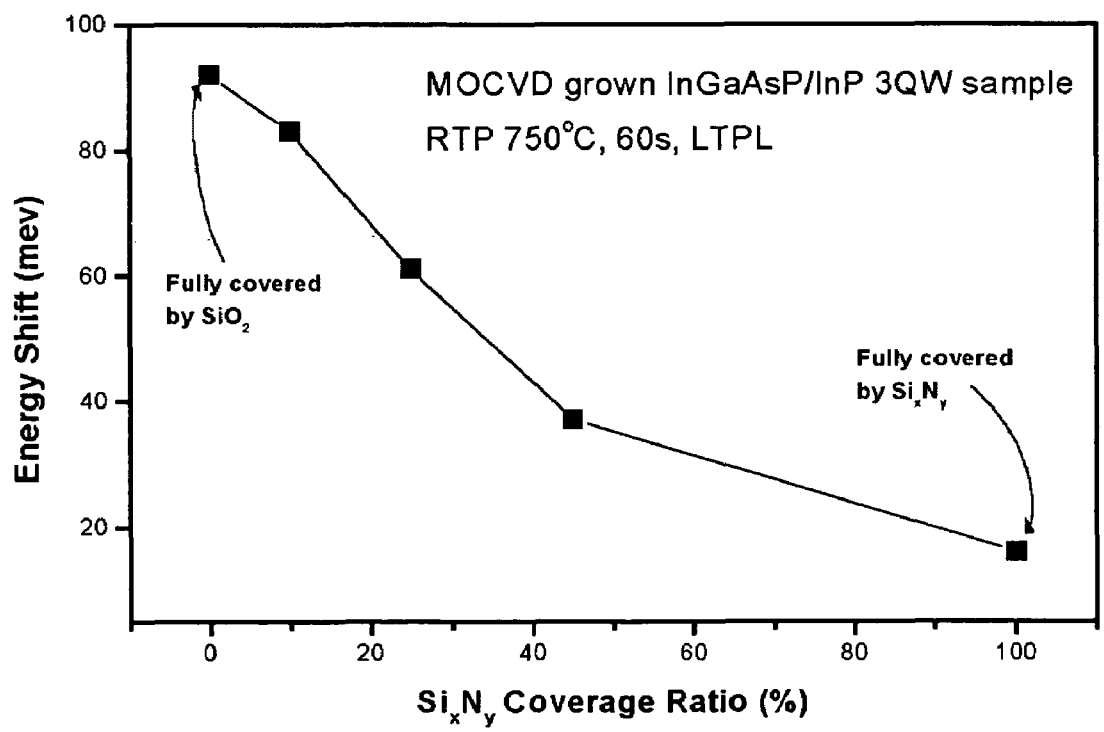
FIG. 10 shows the blueshift of the transaction energy versus the $Si_xN_y$ coverage ratio of the samples used in the experiments whose results appear in the graph of FIG. 9.

FIG. 10 shows the blueshift of transition energy versus the $Si_xN_y$ coverage ratio of the samples used in the experiments shown in FIG. 9. The X axis of FIG. 10 indicates the $Si_xN_y$ coverage ratio expressed as a percentage of the surface area, the Y axis represents the energy shift in meV. This graph shows that the largest blueshift was exhibited by the sample that was fully covered with $SiO_2$. The least shift was that exhibited by the sample having its surface fully covered by $Si_xN_y$. Three intermediate values were also shown. Using this technique the inventors were able to achieve at least five different transition energies in different areas of a single semiconductor heterostructure using just two different materials and one thermal annealing step.

The inventors have found that the same technique may also be applied to a combination of $Si_xN_y$ and LTInP or $Si_xN_y$ and LT(In)GaAs but with a larger blueshift in the photoluminscent spectra for the same $Si_xN_y$ coverage ratio. Other favourable results were found using a combination of $SiO_2$ and LTInP or $SiO_2$ and LT(In)GaAs because the materials vary the intermixing efficiency of the quantum region to different degrees.

To obtain a wider range of transition energy shifts when fabricating more complicated or large scale photonic integrated circuits, three or more layers of materials can be employed at the same time. By varying the coverage ratios of the various materials many more transition energy shifts can be achieved across the heterostructure.

Figure 11:
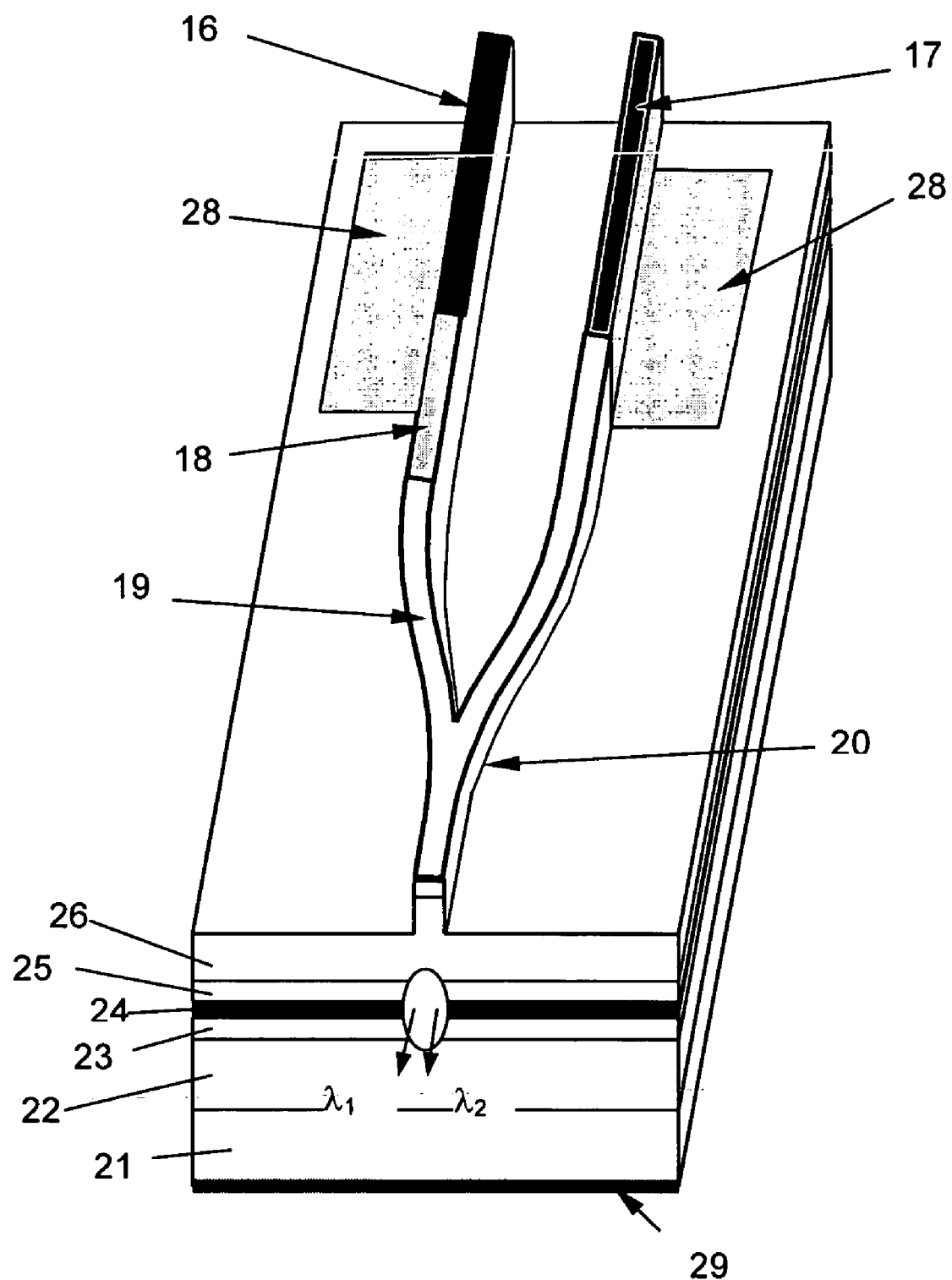
FIG. 11 is a perspective schematic diagram of a monolithically integrated dual wavelength ridge waveguide laser manufactured according to the invention.

One application example of the present invention is shown in FIG. 11. That figure shows a perspective schematic diagram of a monolithically integrated dual wavelength ridge waveguide laser. The example shown is a graded index separate confinement heterojunction (GRINSCH) laser structure. The n-type substrate 21 may be a GaAs or InP semiconductor or the like. On top of the substrate 21 is a lower cladding layer 22 with n-type doping to $2 \times 10^{18}$ cm$^{-3}$. The laser also includes an upper cladding layer 26 with p-type doping to $5 \times 10^{18}$ cm$^{-3}$. Between the lower and upper cladding layers lie the lower 23 and upper 25 confinement layers which sandwich the active region 24 which, in this example, is a quantum well structure. The laser also includes metal contacts 28, 29 for the electrodes.

By applying different layers of different materials to the surface of the semiconductor heterostructure in different patterns, a number of different regions, each exhibiting different wavelengths, can be achieved. In this example, the combination of two films, either $SiO_2$ and $Si_xN_y$, or LTInP-LT(In)GaAs and $Si_xN_y$ may be used to achieve wavelengths $\lambda_1$, $\lambda_2$, $\lambda_3$ and $\lambda_4$.

In this example gain region 16 has wavelength $\lambda_1$ and gain region 17 has wavelength $\lambda_2$. The Y-junction coupler region 19 has a transition energy with wavelength $\lambda_4$ that is short enough to ensure that it is completely transparent to wavelengths $\lambda_1$ and $\lambda_2$. The isolator 18 has a wavelength $\lambda_3$ that should be transparent to $\lambda_1$ but which absorbs wavelength $\lambda_2$ so that laser light from the gain region 17 will not optically pump gain region 16 when only gain region 17 is electrically biased. In this way the four different band gap regions in the wafer can be used to produce a monolithically integrated dual wavelength ridge waveguide laser.

Figure 12:
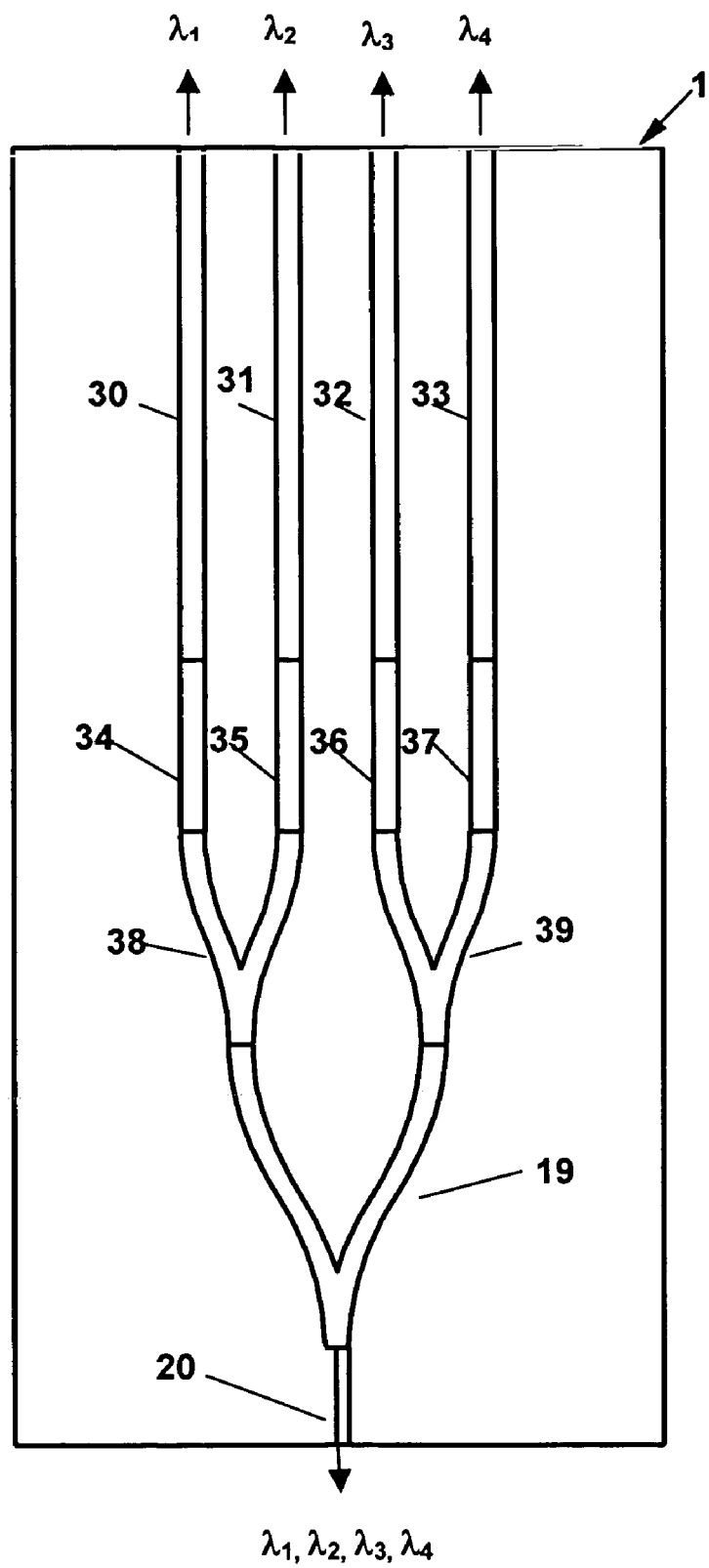
FIG. 12 is a plan view of a schematic diagram of a laser source with four different wavelengths, which could be manufactured according to the method of the present invention.

FIG. 12 shows another example of an application of the present invention. That figure shows a plan view of a schematic diagram of a laser source with four different wavelengths, each of which have monolitically integrated modulators. In order to manufacture such a laser, the transition energy level of the heterostructure requires nine different values at nine different regions across the surface. In order to achieve this result, three different encapsulating layers should be used with the patterning techniques illustrated with reference to FIGS. 6A to 6I.

As shown in FIG. 12, the semiconductor heterostructure 1 should have the patterned layers applied to it in such a way as to produce active laser regions 30, 31, 32 and 33 having wavelengths $\lambda_1$, $\lambda_2$, $\lambda_3$ and $\lambda_4$ respectively. These active regions should be integrated with modulators 34, 35, 36 and 37 which each have transition energy levels which are slightly larger than those of the active regions to which they are connected. These modulators are integrated with Y-junction couplers 38 and 39 which are integrated with a further Y-junction coupler 19. These three Y-junction couplers combine to couple the four laser beams into the one output wave guide 20 which exhibits all four wavelengths. The Y-junction couplers should have transition energy levels and output wave guides which are larger than those of the active regions and the modulator regions in order to avoid absorption.

In order to form such a laser the heterostructure 1 needs to exhibit nine different transition energy levels, one for each of the four active regions, one for each of the four modulator regions and one further transition energy level for the three Y-junction couplers together. The present invention provides a method of readily achieving nine or more different transition energy levels in different areas of a single heterostructure.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for forming a modified semiconductor having a plurality of band gaps, the method comprising the steps of:
   providing a semiconductor having a surface and a quantum region which emits photons in response to electrical or optical stimulation, the quantum region having an original band gap and being disposed under said surface;
   applying a plurality of layers of a plurality of materials to a plurality of selected regions of said surface, said plurality of materials being adapted to cause, upon thermal annealing, a plurality of degrees of intermixing in a plurality of portions of said quantum region disposed immediately below each of said selected regions of said surface; and
   thermally annealing said plurality of layers to said surface such that said layers of said materials cause said plurality of degrees of intermixing in said plurality of portions of said quantum region thereby shifting the original band gaps of said portions of said quantum region,
   thereby forming a modified semiconductor which exhibits a plurality of different band gaps in said plurality of portions of said quantum region depending upon the positioning of said plurality of layers of said plurality of materials on the surface immediately above the respective portions of said quantum region.

2. A method according to claim 1 wherein said plurality of layers comprises between two and five layers and wherein said plurality of materials comprises between two and five materials.

3. A method according to claim 1 wherein at least one of said materials is selected from the group consisting of:
   (a) $SiO_2$; and
   (b) $Si_xN_y$, wherein x and y are integers greater than 0.

4. A method according to claim 3 wherein said step of applying said plurality of layers of said plurality of materials to said plurality of selected regions of said surface comprises applying at least one of layers using one or more of the following techniques:
   (a) plasma enhanced chemical vapor deposition (PECVD);
   (b) E-beam evaporation; or
   (c) the spin-on method.

5. A method according to claim 1 wherein at least one of said materials is selected from the group consisting of:
   (a) LTInP (low temperature deposited InP); and
   (b) LT(In)GaAs (low temperature deposited InGaAs or GaAs).

6. A method according to claim 5 wherein said step of applying said plurality of layers of said plurality of materials to said plurality of selected regions of said surface comprises applying at least one of said layers using one or more of the following techniques at a lower epitaxy temperature:
   (a) metal organic chemical vapor deposition (MOCVD); or
   (b) molecular beam epitaxy (MBE).

7. A method according to claim 1 wherein the step of applying a plurality of layers of a plurality of materials to a plurality of selected regions of said surface comprises applying one or more of said layers in a pattern.

8. A method according to claim 7 wherein said step of applying one or more of said layers in a pattern comprises:
   (a) applying said layer to said selected region of said surface; and
   (b) patterning said layer using one or more of the following techniques:
      (i) photolithography; or
      (ii) electron-beam lithography.

9. A method according to claim 7 wherein said step of applying one or more of said layers in a pattern comprises applying said one or more layers in one or more modes selected from the group consisting of:
   (a) a dot pattern comprising a plurality of dots separated by a plurality of spaces;
   (b) an inverse dot pattern comprising a plurality of inverse dots separated by a plurality of inverse spaces;
   (c) a line pattern comprising a plurality of lines separated by a plurality of spaces;
   (d) an inverse line pattern comprising a plurality of inverse lines separated by a plurality of inverse spaces; and
   (e) a planar pattern.

10. A method according to claim 9 wherein said dots, inverse dots, lines and inverse lines have relatively uniform diameters within each pattern and wherein said spaces and inverse spaces are relatively uniform within each pattern.

11. A method according to claim 10 wherein said diameters of said dots are less than or equal to 2 μm.

12. A method according to claim 10 wherein said spaces and inverse spaces are less than or equal to 2 μm.

13. A method according to claim 1 wherein said step of applying said plurality of layers of said plurality of materials to said plurality of selected regions of said surface comprises applying said layers to a thickness ranging from 10 nm to 500 nm.

14. A method according to claim 1 wherein said step of thermally annealing said heterostructure comprises rapidly thermally annealing said heterostructure by heating said heterostructure at temperatures ranging from 500 m to 1000° C. for periods of time ranging from 1 to 1000 seconds.

15. A method according to claim 1 wherein said semiconductor comprises:
   (a) a semiconductor substrate; and
   (b) a quantum region.

16. A method according to claim 15 wherein said semiconductor substrate is made from either:
   (a) InP; or
   (b) GaAs.

17. A method according to claim 15 wherein said quantum region comprises one or more of:
   (a) a single quantum well structure;
   (b) a multiple quantum well structure;
   (c) a super lattice structure;
   (d) a quantum wire structure; or
   (e) a quantum dot structure.

18. A method according to claim 17 wherein said quantum well structure comprises of one or more of:
(a) InGaAsP/InGaAsP;
(b) InGaAsP/InP;
(c) InGaAs/InP;
(d) GaAs/AlGaAs;
(e) InGaAs/GaAs;
(f) InGaAlAs/GaAs; or
(g) InGaAsN/GaAs.

19. A method according to claim 2 wherein at least one of said materials is selected from the group consisting of:
(a) $SiO_2$; and
(b) $Si_xN_y$, wherein x and y are integers greater than 0.

20. A method according to claim 19 wherein said step of applying said plurality of layers of said plurality of materials to said plurality of selected regions of said surface comprises applying at least one of layers using one or more of the following techniques:
(a) plasma enhanced chemical vapor deposition (PECVD);
(b) E-beam evaporation; or
(c) the spin-on method.

21. A method according to claim 2 wherein at least one of said materials is selected from the group consisting of:
(a) LTInP (low temperature deposited InP); and
(b) LT(In)GaAs (low temperature deposited InGaAs or GaAs).

22. A method according to claim 21 wherein said step of applying said plurality of layers of said plurality of materials to said plurality of selected regions of said surface comprises applying at least one of said layers using one or more of the following techniques at a lower epitaxy temperature:
(a) metal organic chemical vapor deposition (MOCVD); or
(b) molecular beam epitaxy (MBE).

23. A method according to claim 2 wherein the step of applying a plurality of layers of a plurality of materials to a plurality of selected regions of said surface comprises applying one or more of said layers in a pattern.

24. A method according to claim 23 wherein at least one of said materials is selected from the group consisting of:
(a) $SiO_2$; and
(b) $Si_xN_y$, wherein x and y are integers greater than 0.

25. A method according to claim 24 wherein said step of applying said plurality of layers of said plurality of materials to said plurality of selected regions of said surface comprises applying at least one of layers using one or more of the following techniques:
(a) plasma enhanced chemical vapor deposition (PECVD);
(b) E-beam evaporation; or
(c) the spin-on method.

26. A method according to claim 25 wherein at least one of said materials is selected from the group consisting of:
(a) LTInP (low temperature deposited InP); and
(b) LT(In)GaAs (low temperature deposited InGaAs or GaAs).

27. A method according to claim 26 wherein said step of applying said plurality of layers of said plurality of materials to said plurality of selected regions of said surface comprises applying at least one of said layers using one or more of the following techniques at a lower epitaxy temperature:
(a) metal organic chemical vapor deposition (MOCVD); or
(b) molecular beam epitaxy (MBE).

28. A method according to claim 23 wherein said step of applying one or more of said layers in a pattern comprises:
(a) applying said layer to said selected region of said surface; and
(b) patterning said layer using one or more of the following techniques:
(i) photolithography; or
(ii) electron-beam lithography.

29. A method according to claim 28 wherein said step of applying one or more of said layers in a pattern comprises applying said one or more layers in one or more of:
(a) a dot pattern comprising a plurality of dots separated by a plurality of spaces;
(b) an inverse dot pattern comprising a plurality of inverse dots separated by a plurality of inverse spaces;
(c) a line pattern comprising a plurality of lines separated by a plurality of spaces;
(d) an inverse line pattern comprising a plurality of inverse lines separated by a plurality of inverse spaces; or
(e) a planar pattern.

30. A method according to claim 29 wherein said dots, inverse dots, lines and inverse lines have relatively uniform diameters within each pattern and wherein said spaces and inverse spaces are relatively uniform within each pattern.

31. A method according to claim 30 wherein said diameters of said dots and lines is less than or equal to 2 µm.

32. A method according to claim 31 wherein said spaces and inverse spaces are less than or equal to 2 µm.

33. A method according to claim 19 wherein said step of applying said plurality of layers of said plurality of materials to said plurality of selected regions of said surface comprises applying said layers to a thickness ranging from 10 nm to 500 nm.

34. A method according to claim 23 wherein said step of applying said plurality of layers of said plurality of materials to said plurality of selected regions of said surface comprises applying said layers to a thickness ranging from 10 nm to 500 nm.

35. A method according to claim 23 wherein said step of thermally annealing said heterostructure comprises rapidly thermally annealing said heterostructure by heating said heterostructure at temperatures ranging from 500 to 1000° C. for periods of time ranging from 1 to 1000 seconds.

36. A method according to claim 23 wherein said semiconductor comprises:
(a) a semiconductor substrate; and
(b) a quantum region.

37. A method according to claim 36 wherein said semiconductor substrate is made from either:
(a) InP; or
(b) GaAs.

38. A method according to claim 37 wherein said quantum region comprises one or more of:
(a) a single quantum well structure;
(b) a multiple quantum well structure;
(c) a super lattice structure;
(d) a quantum wire structure; or
(e) a quantum dot structure.

39. A method according to claim 38 wherein said quantum well structure comprises of one or more of:
(a) InGaAsP/InGaAsP;
(b) InGaAsP/InP;
(c) InGaAs/InP;
(d) GaAs/AlGaAs;
(e) InGaAs/GaAs;
(f) InGaAlAs/GaAs; or
(g) InGaAsN/GaAs.

40. A modified semiconductor having a plurality of band gaps, the semiconductor comprising:
  (a) a surface;
  (b) a quantum region which emits photons in response to electrical or optical stimulation, the quantum region having an original band gap and being disposed under said surface; and
  (c) a plurality of layers of a plurality of materials disposed on a plurality of selected regions of said surface, said plurality of materials being adapted to cause, upon thermal annealing, a plurality of degrees of intermixing in a plurality of portions of said quantum region disposed immediately below each of said selected regions of said surface;

wherein the plurality of layers are thermally annealed to said surface, and wherein said modified semiconductor exhibits a plurality of different band gaps in said plurality of portions of said quantum region according to the positioning of said plurality of layers of said plurality of materials on the surface immediately above the respective portions of said quantum region.

* * * * *